(12) United States Patent
Lee et al.

(10) Patent No.: US 7,645,688 B2
(45) Date of Patent: Jan. 12, 2010

(54) METHOD OF GROWING NON-POLAR M-PLANE NITRIDE SEMICONDUCTOR

(75) Inventors: Soo Min Lee, Seoul (KR); Masayoshi Koike, Gyunggi-Do (KR); Sung Hwan Jang, Gyunggi-Do (KR); Hyo Won Suh, Jeollanam-Do (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 306 days.

(21) Appl. No.: 11/790,329

(22) Filed: Apr. 25, 2007

(65) Prior Publication Data

US 2007/0254459 A1    Nov. 1, 2007

(30) Foreign Application Priority Data

Apr. 25, 2006    (KR) ............... 10-2006-0037327

(51) Int. Cl.
*H01L 21/20* (2006.01)
*H01L 21/36* (2006.01)

(52) U.S. Cl. ............. 438/478; 257/13; 257/E33.019

(58) Field of Classification Search ............. 438/478, 438/117; 257/13, 94, 95
See application file for complete search history.

(56) References Cited

U.S. PATENT DOCUMENTS

| 7,129,107 B2* | 10/2006 | Okuyama et al. ......... 438/47 |
| 2003/0198837 A1 | 10/2003 | Craven et al. |
| 2006/0255341 A1* | 11/2006 | Pinnington et al. ......... 257/79 |

FOREIGN PATENT DOCUMENTS

JP    10-321910    * 12/1998

* cited by examiner

*Primary Examiner*—Thanh V Pham
*Assistant Examiner*—Mohammad M Choudhry
(74) *Attorney, Agent, or Firm*—McDermott Will & Emery LLP

(57) ABSTRACT

A method of growing a non-polar m-plane nitride semiconductor. A (11-23) plane sapphire substrate is prepared, and a non-polar (10-10) nitride semiconductor is grown on the sapphire substrate. The present invention can also be applied to a method for manufacturing other m-plane hexagonal semiconductors.

9 Claims, 5 Drawing Sheets

(a)

(b)

(a)

(b)

METHOD OF GROWING NON-POLAR M-PLANE NITRIDE SEMICONDUCTOR

CLAIM OF PRIORITY

This application claims the benefit of Korean Patent Application No. 2006-0037327 filed on Apr. 25, 2006, in the Korean Intellectual Property Office, the disclosure of which is incorporated herein by reference.

BACKGROUND OF THE INVENTION

1. Field of the Invention

The present invention relates to a method of manufacturing a nitride semiconductor and, more particularly, to a method of manufacturing a non-polar m-plane nitride semiconductor.

2. Description of the Related Art

In general, a group III nitride semiconductor is characterized by capability of emitting light in a wide range including the entire visible ray region and extended to the ultra-violet ray region, and has gained attention as a light emitting device material for realizing blue or green.

A nitride semiconductor is grown on a composite substrate such as sapphire ($Al_2O_3$) or silicon carbide (SiC) through vapor phase growth methods like Metal Organic Chemical Vapor Deposition (MOCVD), Hydride Vapor Phase Epitaxy (HVPE) or Molecular Beam Epitaxy (MBE).

Conventionally, a nitride single crystal grown in a c-axis [0001] of the composite substrate has been mainly used for the nitride light emitting device, which however, exhibits strong piezoelectricity, degrading the efficiency of the light emitting device. That is, in the active layer of the c-plane nitride layer, an electric field stemming from the piezoelectric effects, i.e., a piezoelectric field is applied in an opposite direction from an external electric field due to the peculiar characteristics of GaN. As shown in FIG. 1a, the wave functions of an electron and a hole are spatially in disagreement, resulting in degraded recombination efficiency.

Recently, in order to increase the light emission efficiency by controlling such polarization characteristics, there have been actively sought ways to grow and apply an a-plane or m-plane non-polar nitride layer to the light emitting device. Unlike the polar nitride layer, the non-polar nitride layer does not entail polarization, and thus no electric field is applied internally. Therefore, in the active layer with the non-polar nitride layer adopted, the wave functions of the electron and hole almost ideally coincide with each other as shown in FIG. 1b.

As a conventional method of growing a non-polar nitride layer, U.S. Patent No. 2003/0198837 (published on Oct. 23, 2003 and invented by Michael D. Craven et al.) suggests using an r-plane (10-12) sapphire substrate or an a-plane hexagonal substrate such as ZnO or SiC to grow an a-plane (10-10) nitride layer.

However, not as stable as the m-plane nitride layer in terms of surface energy, it is known that stripe patterns are formed on the surface of the a-plane nitride layer during growth. Additionally, as in FIG. 2, macro pits are formed on the surface due to the anisotropy in growth rate along with c-axis. Such pits provide paths for leakage current in the light emitting device, thus causing significant deterioration of the light emission efficiency.

On the other hand, the m-plane (10-10) nitride semiconductor is non-polar like the a-plane, but has lower surface energy and thus is more stable, thereby resulting in a relatively planar surface during the growth. Such an m-plane nitride semiconductor has a unique lattice constant, so the substrates such as $LiAlO_2$, m-plane ZnO and m-plane SiC have been used experimentally as a growth substrate.

However, these substrates have demerits as a growth substrate for the m-plane nitride semiconductor. For example, the $LiAlO_2$ substrate is too expensive, the ZnO substrate is chemically unstable, and the SiC substrate is limited in area like the ZnO substrate, hindering the growth of the m-plane semiconductor.

SUMMARY OF THE INVENTION

The present invention has been made to solve the foregoing problems of the prior art and therefore an aspect of the present invention is to provide a method of growing an m-plane nitride semiconductor using a sapphire substrate in a relatively large size with high crystal quality.

According to an aspect of the invention, the invention provides a method of manufacturing a nitride semiconductor. The method includes preparing a (11-23) plane sapphire substrate; and growing a non-polar (10-10) m-plane nitride semiconductor on the sapphire substrate.

Specifically, a crystal surface of the sapphire substrate may have an offset angle in a range of substantially ±5° about c-axis direction, and in a range of substantially ±5° about a direction perpendicular to c-axis.

According to an embodiment of the present invention, the method may further include growing a buffer layer having an m-plane hexagonal structure on the sapphire substrate before growing the non-polar m-plane nitride semiconductor. For example, the buffer layer may comprise ZnO or SiC.

The nitride semiconductor applicable to the present invention may comprise a material that satisfies a composition formula of $Al_xIn_yGa_{(1-x-y)}N$, where $0 \leq x \leq 1$, $0 \leq y \leq 1$ and $0 \leq x+y \leq 1$. The step of growing a nitride semiconductor may comprise hydride vapor phase epitaxy.

In addition, to provide a nitride single crystal substrate, the method may further comprise removing the sapphire substrate from the m-plane nitride semiconductor.

The present invention can also be applied to a method of manufacturing other hexagonal crystal structure semiconductors. That is, the method includes preparing a (11-23) plane sapphire substrate; and growing a semiconductor having a (10-10) m-plane hexagonal crystal structure on the sapphire substrate.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

In this specification, it should be noted that the miller indices uses "-" before the number in place of a bar on the number. For example, "-2" in (11-23) should be understood as identical to "2" with a bar on top.

The present invention adopts a crystal surface that can satisfy the growth conditions of an m-plane nitride semiconductor in a sapphire substrate generally used as a nitride growth substrate, in particular m-plane GaN, and provides a method of growing m-plane GaN using a sapphire substrate machined to have this crystal surface as a growth substrate.

The sapphire substrate adopted in the present invention has (11-23) plane as a growth surface. For example, (11-23) plane can be understood as a surface cut obliquely about a c-axis direction. The (11-23) plane of the sapphire substrate can minimize a lattice constant difference with m-plane GaN to provide conditions similar to those in the conventional growth of a-plane GaN on an r-plane sapphire substrate.

Exemplary embodiments of the present invention will now be described in detail with reference to the accompanying drawings.

Figure 1A:
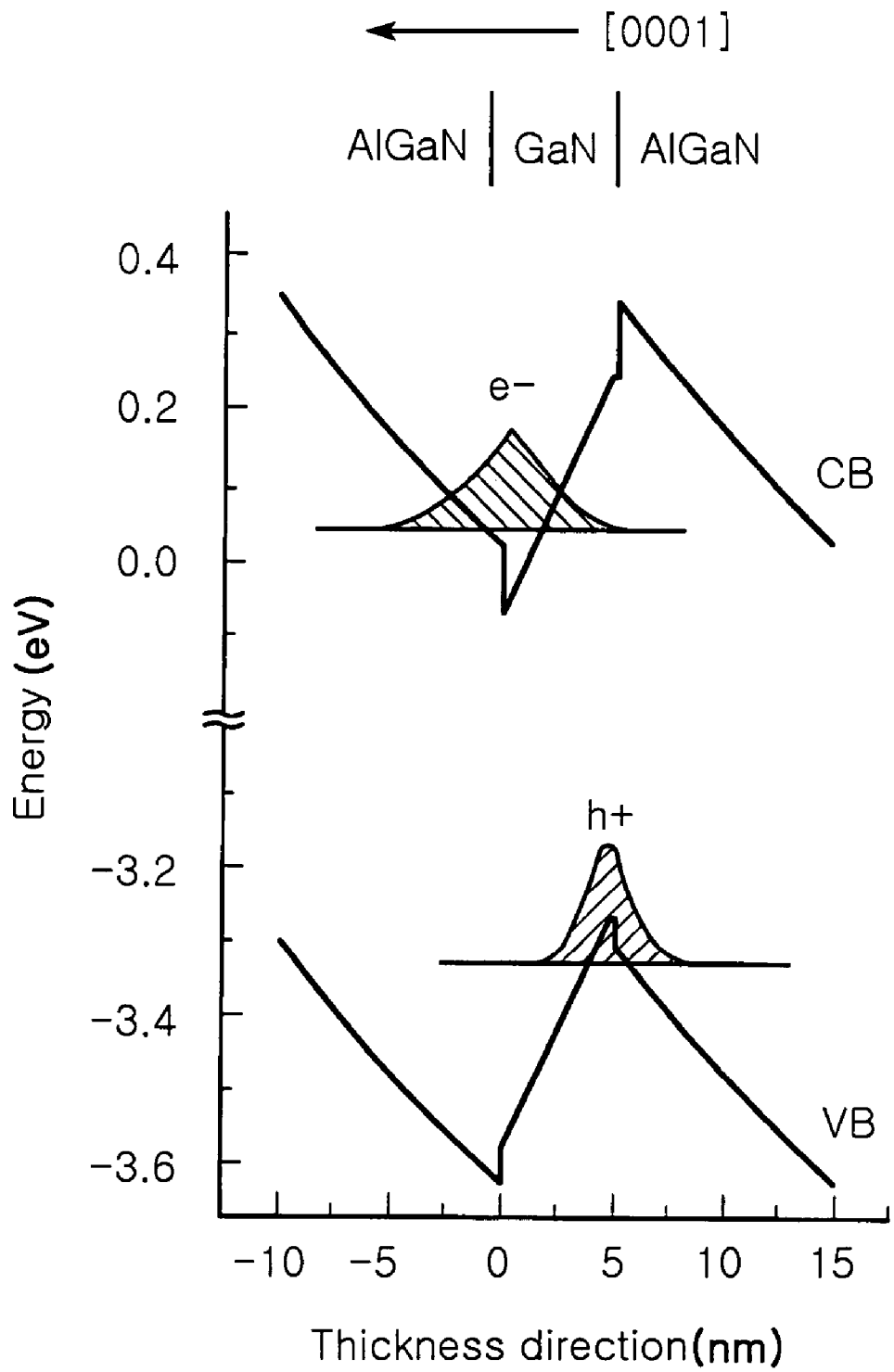
FIGS. 1a and 1b are graphs illustrating the energy band diagrams and wave functions of electrons and holes to explain the effects of the piezoelectric field.
Figure 1B:
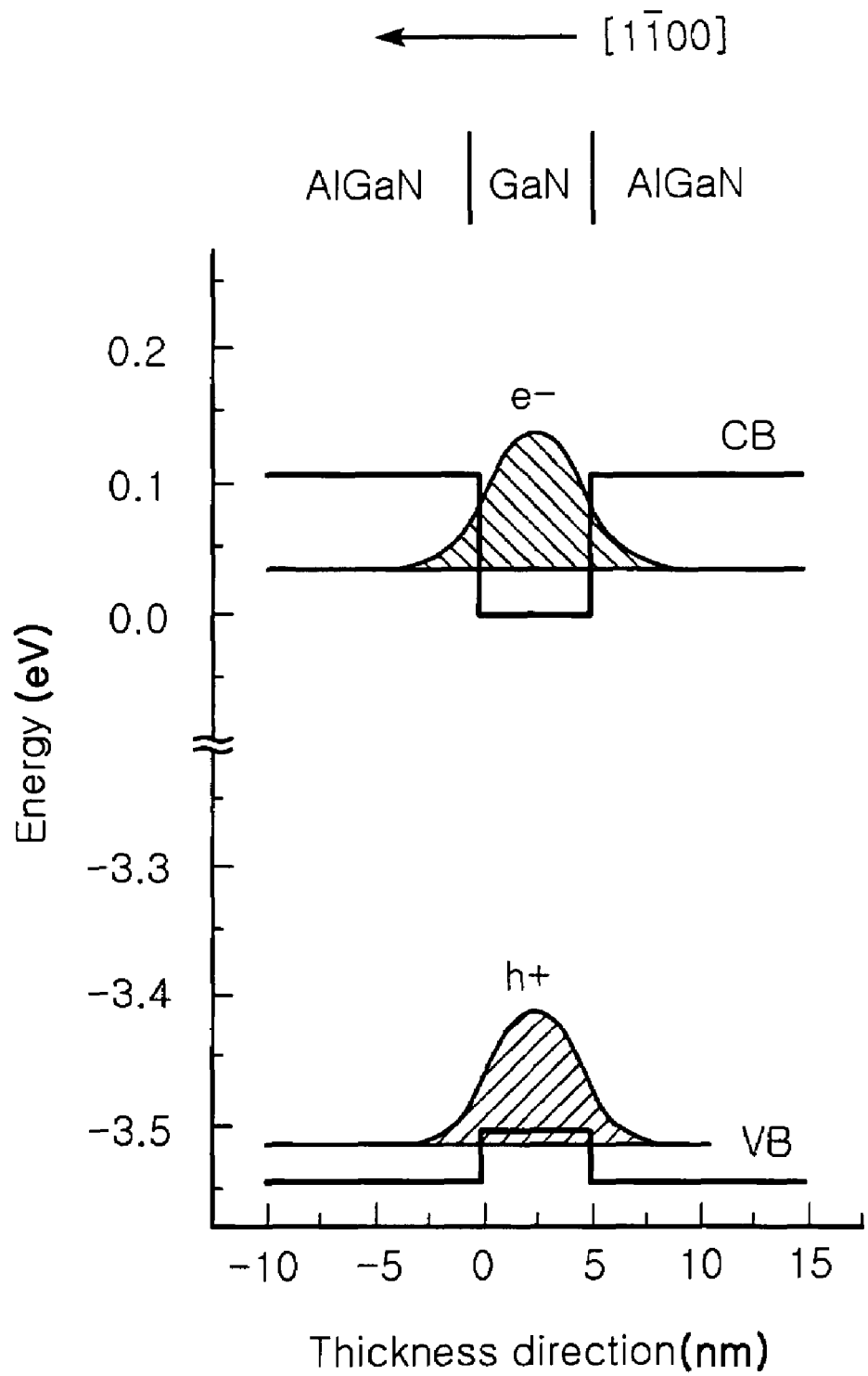
Figure 2:
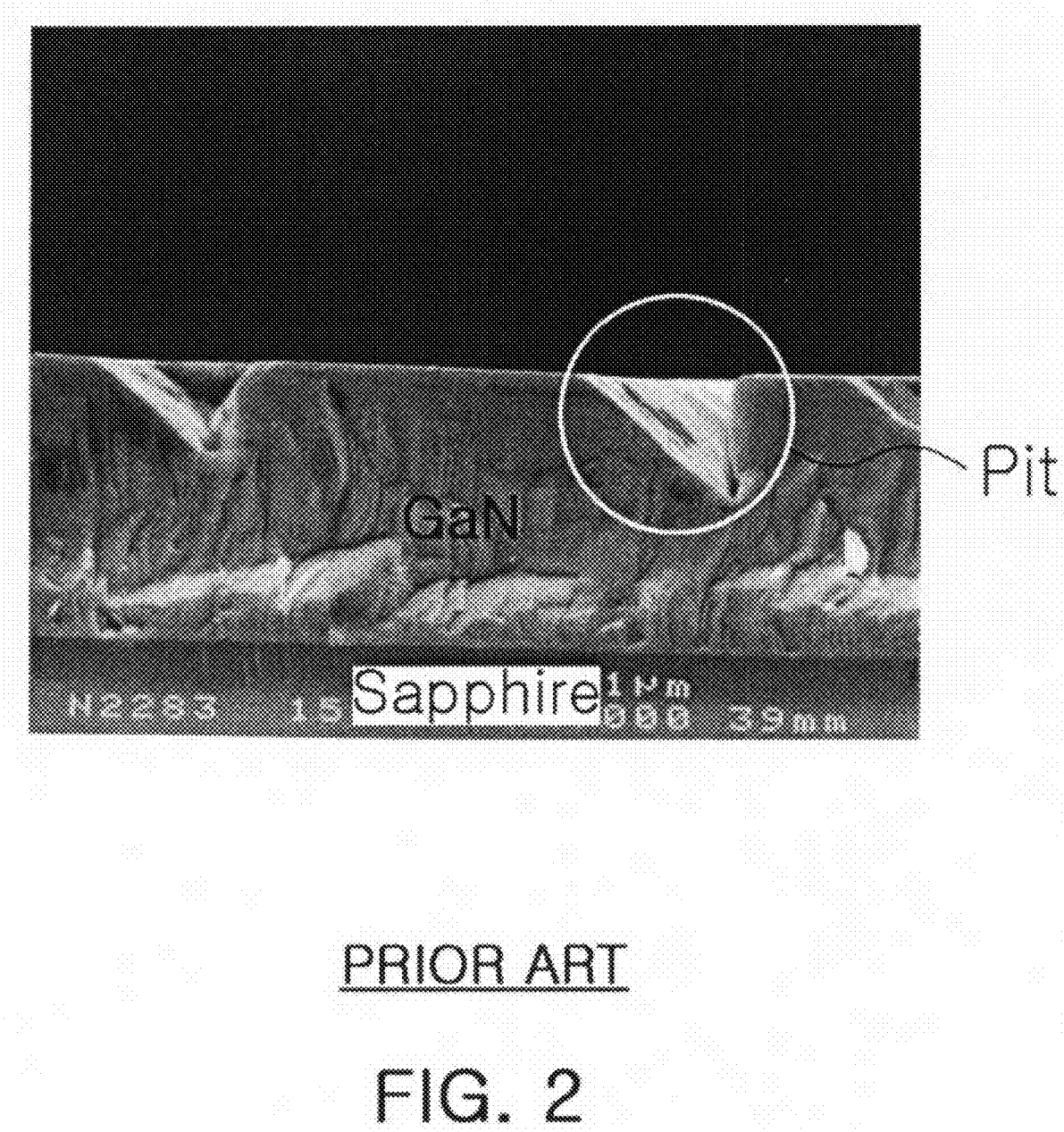
FIG. 2 is a SEM picture taken on a section of a typical a-plane nitride semiconductor.
Figure 3:
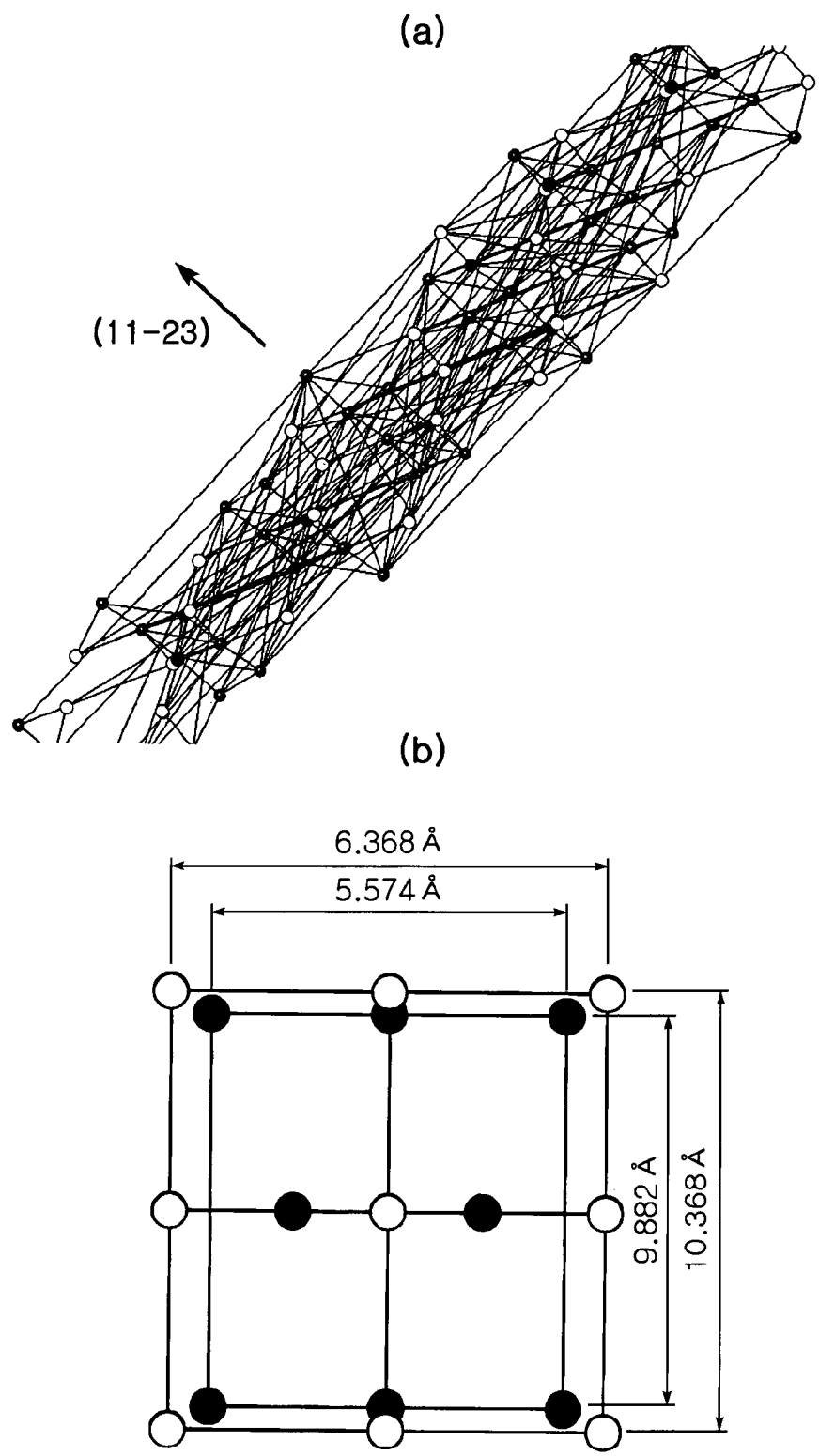
FIG. 3(a) and (b) are schematic views illustrating the crystal structure of the sapphire substrate and the comparison of the lattice points of (11-23) sapphire substrate and m-plane gallium nitride.

FIG. 3(a) schematically illustrates a hexagonal sapphire ($Al_2O_3$) crystal structure. The present invention adopts a sapphire substrate having (11-23) plane as a growth surface (i.e., the upper surface) as indicated by an arrow.

FIG. 3(b) is a schematic view showing a comparison of lattice points of (11-23) plane sapphire substrate and (10-10) m-plane GaN. As shown in FIG. 3(b), the (11-23) plane sapphire substrate has a very similar lattice with the m-plane GaN.

More specifically, (10-10) of m-plane GaN has lattice constants of 6.368 Å in an a-axis direction, and of 10.368 Å in a c-axis direction, while (11-23) plane of the sapphire substrate has lattice constant of 5.574 Å in an a-axis direction and of 9.882 Å in a c-axis direction.

Therefore, the compressive stress occurred during the growth of the m-plane GaN on the (11-23) plane sapphire substrate is merely 14% in an a-axis direction and 5% in a c-axis direction. Such compressive stress is similar to the level occurred during the growth of an a-plane GaN layer on an r-plane sapphire substrate according to the prior art (c-axis direction: 1.1% and m-axis direction: 16%).

Therefore, according to the present invention, a generally-used sapphire substrate is cut to have (11-23) plane which minimizes the lattice mismatch, thereby providing a substrate that facilitates growing a (10-10) m-plane GaN thin film with stable quality at relatively low costs.

As described herein, the (10-10) m-plane GaN sought to be obtained by the method according to the present invention is non-polar and has a stable surface, thus capable of remedying the problem due to the pits formed in the non-polar a-plane.

The lattice matching conditions for growing the m-plane GaN layer described hereinabove are not strictly limited to the numbers suggested in FIG. 3(b). That is, the sapphire substrate is not necessarily limited precisely to (11-23). Therefore, the sapphire substrate tilted about the (11-23) plane in a predetermined range can be adopted in the present invention and used as a substrate for growing the m-plane GaN growth.

Considering this, the (11-23) plane of the sapphire substrate adopted in the present invention may have an offset angle in a range of substantially ±5° about a c-axis direction, and in a range of substantially ±5° about a direction perpendicular to a c-axis.

Figure 4:
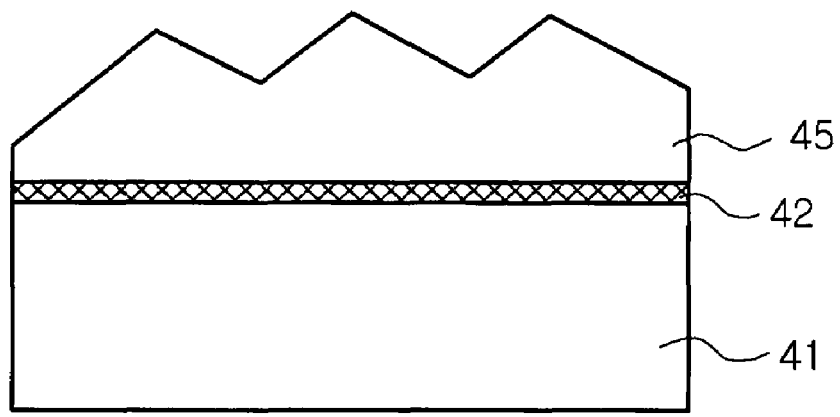
FIG. 4(a) and (b) are sectional views illustrating a conventional a-plane nitride layer and an m-plane nitride layer according to the present invention.
Figure 4:
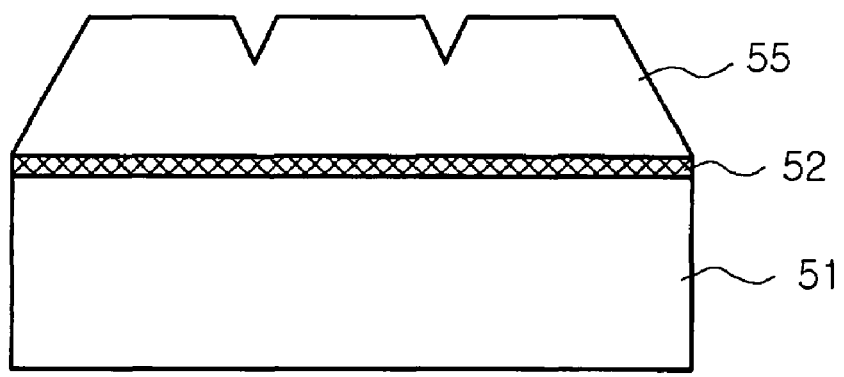

FIGS. 4(a) and 4(b) are sectional views illustrating a conventional a-plane nitride layer and an m-plane nitride layer according to the present invention.

Referring to FIG. 4(a), a non-polar (11-20) a-plane GaN thin film 45 is grown on a (10-12) r-plane sapphire substrate 41 with a buffer layer 42 formed thereon. The buffer layer 42 can be mainly made of a material having a hexagonal crystal structure. As the non-polar a-plane GaN thin film 45 has higher surface energy (about 123 meV/Å$^2$), the grown surface morphology tends to be based on a relatively stable m-plane, resulting in formation of stripes. Also because of the anisotropy in growth rate along with c-axis, macro pits are easily formed on the a-plane surface. Such pits may provide paths for leakage current in a light emitting device, degrading the light emission efficiency as well as significantly lowering the reliability of the device.

On the other hand, as shown in FIG. 4(b), the non-polar (10-10) m-plane GaN thin film 55 can be grown on the (11-23) sapphire substrate 51 with the buffer layer 52 formed thereon. Like in the previous embodiment, the buffer layer 52 may adopt a material having an m-plane hexagonal structure. Preferably, the buffer layer 52 for growing the (10-10) m-plane GaN thin film 55 can be made of ZnO or SiC.

The m-plane GaN thin film 55 grown according to the present invention is non-polar like the a-plane GaN, but has relatively low surface energy (about 118 meV/Å$^2$) compared to a-plane, and thus maintains a more stable state. Therefore, it can significantly suppress formation of the pits and the stripes, and can be utilized as a non-polar GaN layer having excellent characteristics of light emitting device crystals.

The present invention is not limited only to the growth process of a nitride single crystal for forming a light emitting device, and can also be applied to manufacturing a free-standing nitride single crystal substrate. In this case, a step of removing the sapphire substrate from the m-plane GaN can be added to the process shown in FIG. 4(b). The removal of the sapphire substrate can be implemented through a typical laser lift-off process.

In addition, it is advantageous to adopt typical Metal Organic Chemical Vapor Deposition (MOCVD) for the method of manufacturing a light emitting device, whereas it would be advantageous to adopt Hydride Vapor Phase Epitaxy (HVPE), which is suitable for high-speed growth of nitride, for the method of manufacturing a nitride substrate.

The aforedescribed embodiment exemplifies forming a (10-10) m-plane GaN, but the present invention can be applied to a method of manufacturing a nitride semiconductor which satisfies a composition formula of $Al_xIn_yGa_{(1-x-y)}N$, where $0 \leq x \leq 1$, $0 \leq y \leq 1$ and $0 \leq x+y \leq 1$.

Furthermore, the present invention can be applied to formation of a non-polar m-plane crystal in order to manufacture other hexagonal crystal structure semiconductors. Such a method includes, similar to the manufacturing process of m-plane nitride semiconductor described hereinabove, preparing a (11-23) plane sapphire substrate, and growing a semiconductor having (10-10) m-plane hexagonal crystal structure on the sapphire substrate.

According to the present invention set forth above, generally-used (11-23) plane of a sapphire substrate is adopted as a crystal growth surface, facilitating manufacture of an (10-10) m-plane nitride semiconductor which is non-polar and has a stable surface state as compared to the conventional a-plane. Therefore, the present invention allows manufacturing a substrate that is low-cost, has excellent crystal quality and a relatively large size, thereby providing an m-plane nitride semiconductor of excellent quality on a practical level.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a nitride semiconductor, the method comprising steps of:
    preparing a (11-23) plane sapphire substrate; and
    growing a non-polar (10-10) m-plane nitride semiconductor on the (11-23) plane of the sapphire substrate.

2. The method according to claim 1, wherein a crystal surface of the sapphire substrate has an offset angle in a range of substantially ±5° about c-axis direction.

3. The method according to claim 1, wherein a crystal surface of the sapphire substrate has an offset angle in a range of substantially ±5° about a direction perpendicular to c-axis.

4. The method according to claim 1, further comprising growing a buffer layer having an m-plane hexagonal structure on the sapphire substrate before growing the non-polar m-plane nitride semiconductor.

5. The method according to claim 4, wherein the buffer layer comprises ZnO or SiC.

6. The method according to claim 1, wherein the nitride semiconductor comprises a material that satisfies a composition formula of $Al_x In_y Ga_{(1-x-y)} N$, where $0 \leq x \leq 1$, $0 \leq y \leq 1$ and $0 \leq x+y \leq 1$.

7. The method according to claim 1, further comprising removing the sapphire substrate from the m-plane nitride semiconductor.

8. The method according to claim 7, wherein the step of growing a nitride semiconductor comprises hydride vapor phase epitaxy.

9. A method of manufacturing a hexagonal crystal structure semiconductor, the method comprising steps of:
    preparing a (11-23) plane sapphire substrate; and
    growing a semiconductor having a (10-10) m-plane hexagonal crystal structure on the (11-23) plane of the sapphire substrate.

* * * * *